United States Patent [19]

Albrechta et al.

[11] Patent Number: 4,906,803
[45] Date of Patent: Mar. 6, 1990

[54] FLEXIBLE SUPPORTING CABLE FOR AN ELECTRONIC DEVICE AND METHOD OF MAKING SAME

[75] Inventors: Stanley M. Albrechta, Binghamton; Francis C. Burns, Endicott; Gary R. Carden, Endwell; William T. Chen, Endicott; Andrew R. Gresko, Binghamton; John J. Kaufman, Windsor; Eugene P. Skarvinko, Binghamton; Nadia Tonsi, Endicott, all of N.Y.

[73] Assignee: International Business Machines Corporation, Armonk, N.Y.

[21] Appl. No.: 268,449

[22] Filed: Nov. 8, 1988

[51] Int. Cl.$^4$ .................................. H05K 1/00
[52] U.S. Cl. ...................... 174/254; 361/398; 439/77
[58] Field of Search ............ 174/68.5, 250, 254, 174/255, 117 PC, 117 FF; 361/398; 439/77

[56] References Cited

U.S. PATENT DOCUMENTS

| | | | |
|---|---|---|---|
| 3,433,888 | 3/1969 | Tally et al. | 439/77 X |
| 3,683,105 | 8/1972 | Shamash et al. | 174/68.5 |
| 4,231,154 | 11/1980 | Gazdik et al. | 29/840 |
| 4,396,457 | 8/1983 | Bakermans | 156/634 |
| 4,413,308 | 11/1983 | Brown | 361/398 |
| 4,480,288 | 10/1984 | Gazdik et al. | 361/398 |
| 4,508,749 | 4/1985 | Brannon et al. | 427/43.1 |
| 4,517,051 | 5/1985 | Gazdik et al. | 156/644 |
| 4,544,441 | 10/1985 | Hartmann et al. | 156/634 |
| 4,626,462 | 12/1986 | Kober et al. | 174/68.5 X |
| 4,650,545 | 3/1987 | Laakso et al. | 156/655 |
| 4,681,654 | 7/1987 | Clementi et al. | 174/68.5 X |
| 4,704,318 | 11/1987 | Saito et al. | 174/68.5 X |
| 4,791,248 | 12/1988 | Oldenettel | 174/68.5 |

FOREIGN PATENT DOCUMENTS 53-30310 3/1978 Japan .

OTHER PUBLICATIONS

Gazdik et al., "Processing PC Conductor Decals", IBM Technical Disclosure Bulletin, vol. 21, No. 11, Apr. 1979, p. 4425.

*Primary Examiner*—Morris H. Nimmo
*Attorney, Agent, or Firm*—Pollock, Vande Sande & Priddy

[57] ABSTRACT

A flexible supporting cable for an electronic device which includes a steel foil substrate, a layer of polymer on portions of the substrate, circuit pads on the polymer layer having both the bottom and top surfaces of the pads exposed; circuit lines extending from the top surface of the pads, a window free from steel beneath a portion of the circuit lines, and a second, smaller window free from both steel and the polymer beneath a portion of the circuit lines. Methods are provided for fabricating these flexible supporting cables.

6 Claims, 1 Drawing Sheet

FLEXIBLE SUPPORTING CABLE FOR AN ELECTRONIC DEVICE AND METHOD OF MAKING SAME

DESCRIPTION

1. Technical Field

The present invention is concerned with a cable for providing electrical connection between a magnetic head and disk drive used in processors.

In particular, the present invention is concerned with a relatively thin, flexible supporting cable for an electronic device for location between the disk drive and the relatively thick flex cable having, for instance, a ceramic module which, in turn, is connected to a magnetic head. The relatively thin, flexible supporting cable of the present invention makes it possible to locate the magnetic head relatively close to the disk drive, while avoiding the possibility of damage to the head due to the spinning of the disk when in use.

In addition, the present invention is concerned with methods for fabricating the flexible supporting cable.

2. Background Art

In the storage and retrieval of data on magnetic media, a magnetic head is used to send and receive electrical signals to a disk drive used in the processor. The magnetic head is supported by a structure to provide an electrical connection between the head and a relatively thick flex cable provided with, for example, a ceramic module. Currently, this support and connection means is provided by a strip of stainless steel and a twisted wire configuration. This structure must be relatively thin, as compared to the thick flex cable, in order to enable the magnetic head to be located relatively close to the disk drive whereby damage from the disk when spinning is avoided.

Accordingly, the relatively thin, flexible support cable is a relatively delicate cable which must provide for relatively fine-tuned movement, as opposed to the relatively thick flex cable which is connected to the larger in and out movements of the arm.

Because of the need to emplOy the twisted wires, the prior flexible supporting cables are relatively bulky which, in turn, limits the number of circuits that can be operated employing such.

SUMMARY OF INVENTION

The present invention is concerned with a thin, flexible supporting cable that can be fabricated in relatively large quantities at low cost and high reliability, while at the same time, eliminating the need for the twisted wires. This, in turn, makes it possible to increase the circuitry that can be controlled employing flexible cables of the present invention as compared to the prior art because of the significant reduction in the bulk of the cable.

In addition, the present invention provides a flexible cable that has superior mechanical properties as compared to the prior art cable.

The present invention is concerned with a flexible supporting cable that is relatively thin, has double-sided bonding pads, and is sufficiently flexible that when subjected to a force will flex, but will return to an equilibrium configuration once the force is removed. In addition, the flexible supporting cable of the present invention provides for ready electrical and mechanical access.

In particular, the flexible supporting cable of the present invention comprises a steel foil substrate having a layer of polymer on selected portions thereof. Electrically conductive circuit pads at preselected locations on the layer of polymer are provided. Vias are provided in the steel foil substrate and the layer of polymer beneath the circuit pads so as to expose the bottom surface of each of the surface pads to render them capable of being connected by soldering.

Extending from the top side of the circuit pads are circuit lines. Beneath a portion of, and including the extremities of the circuit lines, is a first window free from the steel foil substrate. A second window, smaller than the first window and free from the steel foil substrate and the layer of polymer is provided beneath a portion of the circuit lines.

The present invention is also concerned with a method for forming the above flexible supporting cable. The method comprises applying a layer of a polymeric material to at least one of the major surfaces of a flexible steel foil substrate. An electrically conductive layer is provided on top of the layer of polymeric material. A pattern is etched in the conductive layer to provide circuit pads and circuit lines extending from the top side of the circuit pads. A pattern is etched in the steel foil substrate to provide for vias in the steel foil substrate to expose the bottom surfaces of the circuit pads. A pattern is etched in the steel foil substrate to provide a first window free from steel foil beneath a portion of and including the extremities of the circuit lines. A pattern is etched in the layer of polymeric material to provide vias therein which, in conjunction with vias in the steel foil substrate, expose the bottom surfaces of the circuit pads. A pattern is etched in the layer of polymeric material to provide a second window beneath the circuit lines. The second window is smaller than the first window and is also free form the steel foil substrate so as to expose the underside of the circuit lines.

BEST AND VARIOUS MODES FOR CARRYING OUT THE INVENTION

In accordance with the present invention, a stainless steel foil is employed as the substrate for the flexible supporting cable. The stainless steel foil provides the necessary flexibility and spring action. It also provides resistance to corrosion. Normally, the stainless steel foil is about 1½ mils to about 2 mils thick. A layer of polymeric material is provided on top of one of the major surfaces of the stainless steel foil. The polymeric material is preferably a polyimide. The layer is generally from about 2 microns to about 30 microns thick and preferably about 5 microns to about 10 microns thick and is provided to electrically insulate the steel foil from the subsequently to be applied conductive pads and lines.

On top of the layer of polymeric material at preselected locations are electrically conductive circuit pads. In the preferred aspects of the present invention, the electrically conductive circuit pads include a layer of chromium, a layer of copper, followed by a layer of chromium. The chromium is provided to achieve adhesion between the polymeric layer and copper, while the second layer of chromium is provided temporarily to prevent oxidation of the copper during the processing. The first chromium layer is usually about 400 angstroms to about 800 angstroms, the copper is usually about 50 kiloangstroms to about 100 kiloangstroms, and the second chromium layer, when employed, is usually about 400 angstroms to about 800 angstroms thick.

Beneath a portion of the electrically conductive circuit pads are provided vias in the steel foil substrate and layer of polymeric material so as to expose the bottom surfaces of the circuit pads to render them capable of being soldered.

Circuit lines extend from the top side of the pads and are obtained from the same layers of metals as the circuit pads.

A first window free from the stainless steel foil is provided beneath a portion of and including the extremities of the circuit lines. A second window that is smaller than the first window and is free from both the stainless steel foil and the layer of polymeric material is provided beneath a portion of the circuit lines and preferably in the vicinity of the extremities of the circuit line so that the circuit lines can be completely exposed to the surrounding ambient for subsequent electrical connections.

Figure 1:
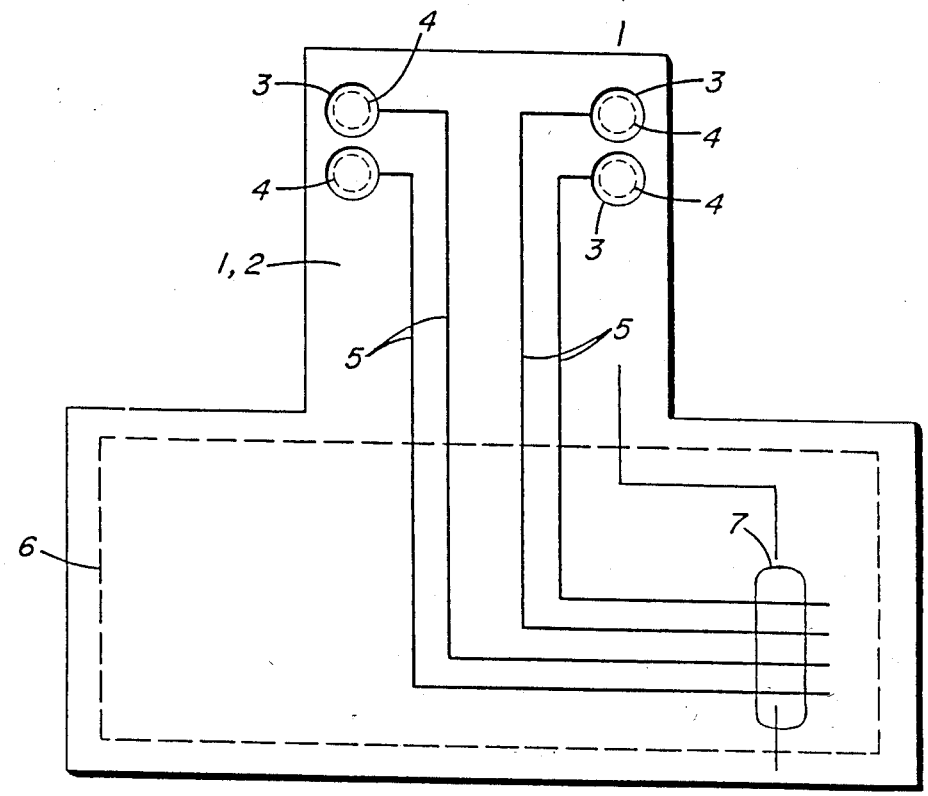
FIG. 1 is a schematic diagram of a flexible supporting cable in accordance with the present invention.

Reference to FIG. 1 illustrates schematically a flexible supporting cable in accordance with the present invention. In particular, numerals (1, 2) represent the stainless steel foil and polymeric composite. Numeral (3) represents the electronic conductive circuit pads. Dotted line (4) represents the material removed from beneath the circuit pads to provide vias. Numeral (5) represents the electronically conductive circuit lines. Dotted line (6) represents the first window of stainless steel material that is removed beneath the circuit lines. Numeral (7) illustrates the polymeric material removed beneath the circuit lines to form the second and smaller window and to expose the bottom of the circuit lines. The removal of the stainless steel material to provide the first window is to assure against the possibility of electrical conduction between the circuit lines and the stainless steel which could possibly occur even in the presence of the polymeric insulating layer.

Figure 2:
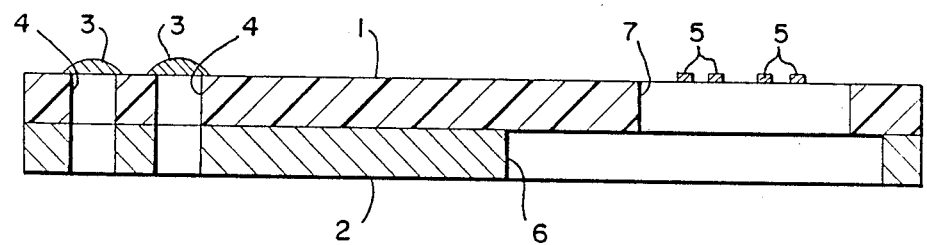
FIG. 2 is a cross-sectional view along line 1-1 of FIG. 1.

FIG. 2 illustrates a cross-sectional view along line 1-1 of FIG. 1 wherein the same numerals represent the same features as in FIG. 1.

The flexible supporting cables of the present invention can be fabricated by various processes and sequence of process steps, some of which are discussed below.

The stainless steel foil is attached to a titanium window frame by spot welding which is used to facilitate fabrication of a number of individual cables from a single sheet of the stainless steel foil. The titanium is resistant to the chemical etchants to be subsequently employed. A typical size for the titanium frame is about 44 mm. A typical stainless steel being a 0.0015" to 0.002" thick stress relieved stainless steel.

A polymeric coating is then applied to the stainless steel foil such as by spraying. The polymeric coating is preferably a thermosetting polymer and most preferably a polyimide. The polyimide can be applied from a solution of a precursor of the polyimide or from a solution of chemically cured polyimide such as a Kapton ®.

The polyimides that can be employed in accordance with the present invention include unmodified polyimides, as well as modified polyimides such as polyester imides, polyamide-imide-esters, polyamide-imides, polysiloxane-imides, as well as other mixed polyimides.

Such are well-known in the prior art and need not be described in any great detail.

Generally, the polyimides include the following recurring unit:

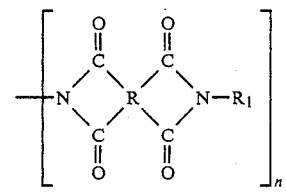

where n is an integer representing the number of repeating units to provide a molecular weight usually about 10,000 to about 100,000. R is at least one tetravalent organic radical selected from the group consisting of:

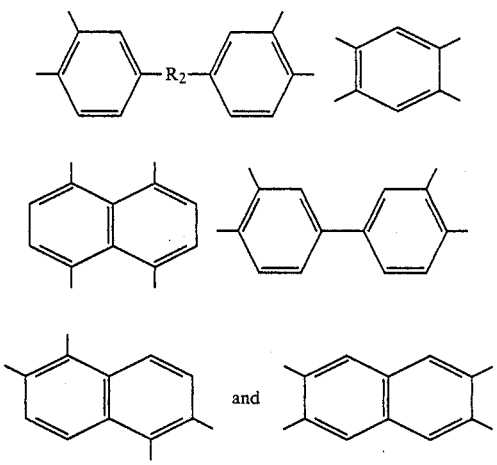

$R_2$ being selected from the group consisting of divalent aliphatic hydrocarbon radicals having from 1 to 4 carbon atoms and carbonyl, oxy, sulfo, hexafluoroisopropylidene and sulfonyl radicals and in which $R_1$ is at least one divalent radical selected from the group consisting of:

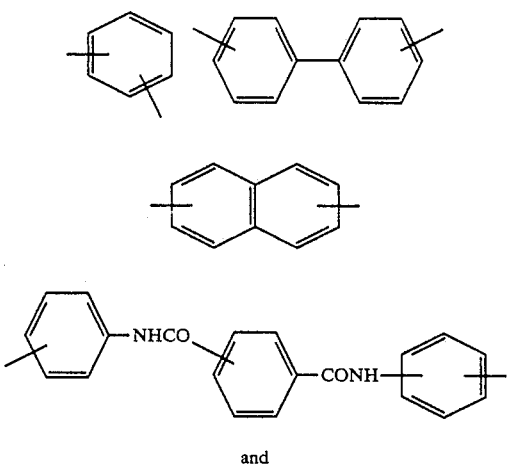

and

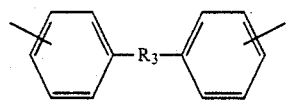

in which $R_3$ is a divalent organic radical selected from the group consisting of $R_2$, silico, and amino radicals. Polymers containing two or more of the R and/or $R_1$ radicals, especially multiple series of $R_1$ containing amido radicals, can be used.

Commercially available polyimide precursors (polyamic acid) are particularly various polyimide precursors from Du Pont and available under the trade designation Pyralin®. This polyimide precursor comes in many grades, including those available Pyralin® polyimide precursors from Du Pont under the further trade designations PI-2225®, PI-2545®, PI-2560®, PI-5878®, PIH-61454®, and PI-2540®. These are all Pyromelletic Dianhydride-Oxydianaline (PMDA-ODA) polyimide precursors.

Commercially available chemically cured polyimides are various polyimides from Du Pont and available under the trade designation Kapton®, including H-Kapton®, V-Kapton®, HN-Kapton®, and VN-Kapton®, which are all chemically cured polyimides. The chemically cured polyimides are generally cured with an anhydride curing agent such as acetic anhydride.

The polyimide can be partially cured at this point such as by heating at about 95° C. for about 12 minutes.

Next, a pattern is etched in the polyimide to correspond to the general profile or shape of the cable. The etching can be accomplished by employing well-known photoresist and photolithographic processing. For instance, a negative resist typically about 0.5 mils thick is applied such as by spraying.

Examples of some photoresists that can be employed include negative or photohardenable polymerizable compositions of the type suggested in U.S. Patents 3,469,982; 3,526,504; 3,867,153; and 3,448,098; and published European patent application 0049504, disclosures of which are incorporated herein by reference. Polymers from methylmethacrylate and from glycidyl acrylate and/or from a polyacrylate such as trimethylol propane triacylate and pentaerythritol triacrylate are commercially available from E. I. Du Pont de Nemours and Company under the trade designation "Riston®".

Examples of some negative photoresists employed according to the present invention are from polymethylmethacrylates such as those commercially available from E. I. Du Pont de Nemours and Company under the trade designations "Riston T-168®" and "Riston 3515®". "Riston T-168®" is a negative photoresist material from polymethylmethacrylate and crosslinkable monomeric units such as from trimethylol propane triacrylate. A detailed discussion of preparing a negative resist from polymethylmethacrylate, trimethylol propane triacrylate, and trimethylene glycol diacetate can be found in Example 1 of U.S. Pat. No. 3,867,153. "Riston 3515®" is a negative photoresist material which is developable in an aqueous medium. Examples of aqueous developable negative photoresists are described in published European patent application 0049504 such as Example 23 thereof, disclosure of which is incorporated herein by refernce. A typical resist described therein is from a copolymer of methylmethacrylate, ethyl acrylate, and acrylic acid, and a copolymer of styrene and maleic anhydride isobutyl ester.

The unexposed portions of Riston T-168® are typically developed or removed by being dissolved in methylchloroform.

Another typical available negative photoresist is Kodak KTFR®, which, according to the manufacturer, is based upon resin systems that contain derivatives of polyisoprene rubber (Levine, et al., Kodak Photoresist Semin. Proc., Vol. 1, pp. 15–17, 1968, Kodak Publ. p. 192A). The Kodak KTFR® is applied by spraying, followed by drying at about 100°–120° C. in an air oven.

In the case of Kodak KTFR® photoresist, such is then exposed to ultraviolet light radiation such as using a Tamarack projection expose tool at about 58 to about 65 millijoules.

The photoresist is developed by employing a methylchloroform spray followed by rinsing using a water spray rinse or freon.

Next, the polyimide in the desired areas is etched. The polyimide can be etched by spraying with potassium hydroxide of about 0.23 molar at about 45° C. at a pressure of about 20 to about 15 psi.

Next, the substrate is sprayed with oxalic acid/water for about 1 minute at about 6 psi, followed by two deionized water rinses.

The photoresist can then be stripped employing J-100 stripper which contains about 35% by volume of perchloroethylene, about 35% by volume of orthodichlorobenzene, about 10% by volume of phenol, and about 20% by volume of alkylaryl sulfonic acid.

The substrate can then be cleaned by rinsing three times in xylene, followed by once in isopropyl alcohol, and then three times in deionized water. The substrate is then dried, for instance, using hot air.

Next, the polymeric layer can be cured, for instance, in the case of a polyimide precursor, can be heated to elevated temperatures such as about 300° C. to about 400° C., typical of which is about 350° C. for about 10 minutes to about 30 minutes, typical of which is about 20 minutes.

If desired, the structure can then be cleaned to remove unwanted residue and debris such as by employing a plasma type clean employing as the plasma gases about 27% by volume of carbon tetrafluoride, about 5% by volume of nitrogen, and about 68% by volume of oxygen at about 400 watts of power for about 10 to about 20 minutes.

A chrome layer can then be provided such as by vacuum evaporation. This layer is usually about 400 angstroms to about 800 angstroms thick.

A copper layer of about 60,000 to about 90,000 angstroms can then be provided such as by vacuum evaporation.

A top chrome layer can then be provided by vacuum evaporation to protect the copper from oxidizing. This top chrome layer is usually about 400 angstroms to about 800 angstroms.

A photoresist is then applied to both sides of the structure by, for instance, spraying a negative photoresist such as Kodak KTFR®, followed by drying at about 100° to about 120° C. in an air oven and exposed and developed to provide a negative of the desired metal pattern on the front side of the structure. The entire back side is blanket exposed. In the case of the Kodak KTFR® negative resist, such is exposed on a Tamarack contact expose projection tool for about 3 to about 5 seconds at about 50 to about 70 millijoules. The photoresist can be developed employing a methylchloroform spray, followed by a freon spray rinse.

The chrome and copper layers which are not protected by the photoresist are then etched in typical chrome and copper etchants, respectively. For instance, a potassium permanganate composition containing about 60 grams/liter of the permanganate and about 20 grams/liter of sodium hydroxide is sprayed at about 100° F. for about 1.2 minutes at a spray pressure of about 8 psi to remove the chromium. The substrate is then rinsed in deionized water. A ferric chloride composition of about 1.280 specific gravity is sprayed at about 30° C. for about 1 minute at a pressure of about 8 psi to remove the copper. The bottom chromium layer is removed by the same procedure discussed above. The structure is rinsed in a 75 gram/liter oxalic acid rinse, followed by two deionized water rinses.

The negative photoresist can then be removed, for instance, by employing J-100.

The substrate is subjected to a precision by rinsing in a solution of a detergent, such as Neutra Clean ®, in deionized water heated to about 65° C. for about 2 to about 4 minutes, followed by three deionized water rinses and then a hot air dry.

Next, another layer of photoresist, such as Kodak KTFR ®, is applied to the top side, dried at about 100° C. to about 120° C. in an air oven, and blanket exposed using a Tamarack projection tool as discussed above, and then developed by spraying methylchloroform. This developing is used as a precaution to remove photoresist that may have deposited on the front side and to insure against having incomplete exposed coating on the back side. In the event of formation of holes in the resist on the back side, additional resist can then be sprayed, followed by drying, blanket exposure, and development.

Next, another layer of photoresist such as Kodak KTFR ® is applied to the back side of the substrate, dried at about 100° C. to about 120° C. in an air oven, and exposed in a predetermined pattern using a Tamarack projection tool as discussed above. The pattern corresponds to that necessary to provide the desired steel pattern of the cable.

The photoresist can then be etched by spraying methylenechloride at about 18 psi for about 2 to 3 minutes, followed by a spray water rinse.

Next, the steel can be removed from those areas to form the first and larger window and expose the back side of the pads.

This step can be carried out by etching away the exposed steel with a ferric chloride etchant such as by spraying at about 50° C. at about 20 psi for about 4 to about 6 minutes.

The remaining photoresist is removed by dipping into a solvent for the photoresist such as J-100.

The polyimide is then removed from the preselected areas by laser etching to provide a second window smaller than the first window behind the circuit lines and to provide vias beneath the circuit pads. The laser etching is carried out with the back side of the part facing towards the laser and employing a wavelength of about 193 to about 351 nanometers with 308 nanometers being preferred and a fluence between about 200 to about 1000 millijoules/cm$^2$, typically about 550 millijoules/cm$^2$, employing a noble gas-halide laser such as xenon chloride or krypton fluoride. The laser etching system can be of either the contact or projection type with projection mode being preferred.

After this, debris can be removed by a plasma removal such as using a gaseous mixture of $CF_4$, $N_2$, and $O_2$ at about 400 watts of power for about 10 to 20 minutes.

The exposed chromium layers on the pads and circuit line are removed by etching such as in a potassium permanganate bath. A typical bath contains about 60 grams/liter of potassium permanganate and about 20 grams/liter sodium hydroxide at about 100° F. for about 1.2 minutes.

Next, the part is rinsed in deionized water, followed by an oxalic acid rinse containing about 75 grams oxalic acid per liter and then another deionized water rinse to remove residue such as manganese dioxide from use of the potassium permanganate bath.

The part is further treated by washing with a mild detergent, such as alconox (an alkaline cleaner), followed by two deionized water rinses, a 15% sulfuric acid rinse for about 3 minutes, and a final 2 minute deionized rinse.

The exposed copper is then electroplated with gold to render it capable of being soldered. The electroplating is carried out for about 20 to about 30 minutes to provide gold layers about 20 to about 60 microinches thick. A typical electroplating bath is available under the trade designation Pure-a-Gold 125 ®, which contains potassium and gold cyanide salts, citric acid, and sodium citrate.

The part is then rinsed in deionized water for about 5 minutes and air dried.

The part is then separated from the titanium frame.

In an alternative sequence of fabricating the supporting cables of the present invention, the polymer, such as the polyimide, is applied by roll coating a roll of the stainless steel foil. The stainless steel is typically 0.0015 inch to 0.002 inch thick stress relieved stainless steel.

The polymeric coating is preferably a thermosetting polymer and most preferably a polyimide. The polyimide can be applied from a solution of polyamic acid precursor or laminated as a film (e.g.-Kapton ®).

The polyimide can be partially cured at this point such as by heating at about 95° C. for about 1.2 minutes and then the stainless steel is cut to 10 inch × 15 inch panels.

Next, a pattern is etched in the polyimide to correspond to the general profile or shape of the cable. The etching can be accomplished by employing well-known photoresist and photolithographic processing. For instance, a negative resist typically about 2 mils thick is applied such as by lamination; a typical resist being Riston T-168 ®.

The photoresist is then exposed to ultraviolet light radiation such as using a Tamarack contact expose tool at about 60 to about 70 millijoules.

The photoresist is developed by employing a methylchloroform spray followed by rinsing using a water spray rinse or freon.

Next, the polyimide in the desired areas is etched. The polyimide can be etched by spraying with potassium hydroxide of about 0.23 molar at about 45° C. at about 20 to about 15 psi.

Next, the substrate is sprayed with oxalic acid/water for about 1 minute at about 6 psi, followed by two deionized water rinses.

The photoresist can then be stripped employing a methylene chloride spray at about 18 psi for about 2 to about 3 minutes, followed by a spray water rinse.

Next, the polymeric layer can be cured, for instance, in the case of a polyimide precursor, can be heated to elevated temperatures typically about 400° C. for typically about 12 minutes under a nitrogen atmosphere in an IR furnace.

If desired, the structure can then be cleaned to remove unwanted residue and debris such as by plasma type cleaning employing as the plasma gases, about 27% by volume of carbon tetrafluoride, about 5% by volume of nitrogen, and about 68% by volume of oxygen at about 400 watts of power for about 10 to about 20 minutes.

A chrome layer can then be provided such as by a sputtering technique. This layer is usually about 100 angstroms to about 200 angstroms thick.

A copper layer of about 2,000 to about 3,000 angstroms can then be provided such as by vacuum evaporation.

A negative photoresist is then applied to the back side of the stainless steel such as by a hot roll laminator. A typical photoresist being Du Pont Riston T-168 ®. The photoresist is then blanket exposed by employing, for example, a Tamarack contact expose tool for about 2 to about 5 seconds at about 58 to about 65 millijoules.

Copper is then plated onto the front side of the structure such as from an acid electroplating bath, typical of which being copper sulfate in aqueous sulfuric acid. The electroplating is carried out for about 23 minutes at about 125 amperes to provide a total copper thickness of about 90,000 angstroms.

A negative photoresist is then applied to the circuit side of the part such as by a hot roll lamination. A typical photoresist being Du Pont Riston T-168 ®. The photoresist is then exposed in the desired pattern by employing, for example, a Tamarack contact expose tool at 58 to 65 millijoules.

The photoresist is developed by employing a methylchloroform spray, followed by rinsing in deionized water.

After this, debris can be removed by a plasma removal such as using a gaseous mixture of $CF_4$, $N_2$, and $O_2$ at about 400 watts of power for about 10 to 20 minutes.

The copper and chrome layers which are not protected by the photoresist are then etched in typical copper and chrome etchants, respectively. The copper can be removed using a ferric chloride composition of about 1.260 specific gravity sprayed at about 30° C. for about 1 minute at a pressure of about 8 psi. A potassium permanganate composition containing about 60 grams/liter of permanganate and about 20 grams/liter of sodium hydroxide is sprayed at about 100° F. for about 1.2 minutes at a spraying pressure of about 8 psi to remove the chromium.

The remaining resist can then be removed, for instance, in the case of Du Pont Riston T-168 ®, employing methylene chloride spray at about 18 psi for about 2 to 3 minutes, followed by a spray water rinse.

The part is then cleaned such as by using Posi-Clean detergent cleaner which contains dilute HCl and surfactants in deionized water at about 50° C. by spraying at about 10 psi, followed by three deionized water rinses and a hot air dry.

Negative photoresist is then applied to the stainless steel side and the circuit side by a hot roll lamination. A typical photoresist being Du Pont Riston T-168 ®. The photoresist on the top or circuit side of the stainless steel is blanket exposed with a Tamarack contact expose tool. The back side is exposed to provide the desired steel etch pattern.

The photoresist is developed by spraying methylchloroform.

Next, the steel can be removed from those areas to form the first layer and larger window and expose the back side of the pads.

This step can be carried out by etching away the exposed steel with a ferric chloride etchant such as by spraying at about 50° C. at about 20 psi for about 4 to about 6 minutes.

The remaining photoresist is removed by spraying a solvent for the photoresist such as methylene chloride at about 18 psi for about 2 to 3 minutes, followed by a spray water rinse.

The polyimide is then removed from the preselected areas by laser etching to provide a second window smaller than the first window behind the circuit lines and to provide vias beneath the circuit pads. The laser etching is carried out with the back side of the part facing towards the laser and employing a wavelength of about 193 to about 351 nanometers with 308 nanometers being preferred and a fluence between about 200 to about 1000 millijoules/cm$^2$, typically about 550 millijoules/cm$^2$, employing a noble gas-halide laser such as xenon chloride or krypton fluoride. The laser etching system can be of either the contact or projection type with projection type being preferred.

After this, debris can be removed by a plasma removal such as using a gaseous mixture of $CF_4$, $N_2$, and $O_2$ at about 400 watts of power for about 10 to 20 minutes.

The exposed chromium layers on the pads and circuit lines are removed by etching such as in a potassium permanganate bath. A typical bath contains about 60 grams/liter of potassium permanganate and about 20 grams/liter sodium hydroxide at about 100° F. for about 1.2 minutes.

Next, the part is rinsed in deionized water, followed by an oxalic acid rinse containing about 75 grams oxalic acid per liter and then another deionized water rinse. The part is further treated by washing with a mild detergent, such as Alconox, followed by two deionized water rinses, a 15% sulfuric acid rinse for about 3 minutes, and a final 2 minute deionized water rinse.

The exposed copper is then electroplated with gold to render it capable of being soldered. The electroplating is carried out for about 20 to about 30 minutes to provide gold layers about 20 to about 60 microinches thick. A typical gold bath being Pure-a-Gold 125 ®, available from OMI International Corporation.

The part is then rinsed in deionized water for about 5 minutes and air dried.

In another sequence of fabricating the supporting cables of the present invention, the stainless steel foil is attached to a titanium window frame by spot welding. A typical size for the titanium frame is about 44 mm. The stainless steel is 0.0015"–0.002" thick stress relieved stainless steel.

A polymeric coating is then applied to one surface of the stainless steel foil such as by spraying or roll coating. The polymeric coating is preferably a thermosetting polymer and most preferably a polyimide. The polyimide can be applied from a solution of polyamic acid precursor or laminated as a film (e.g.-Kapton ®).

The polyimide can be partially cured at this point such as by heating at about 95° C. for about 12 minutes.

Next, the polymeric layer can be fully cured, for instance, in the case of a polyimide, by heating to elevated temperatures such as about 300° C. to about 400° C., typical of which is about 350° C. for about 10 to about 30 minutes; typical of which is about 20 minutes in a nitrogen atmosphere furnace.

If desired, the structure can then be cleaned to remove unwanted residue and debris such as by a plasma cleaning employing as the plasma gases about 27% by volume of carbon tetrafluoride, about 5% by volume of nitrogen, and about 68% by volume of oxygen at about 400 watts of power for about 10 to about 20 minutes.

A chrome layer can then be provided such as by evaporation. This layer is usually about 400 angstroms to about 800 angstroms thick.

A copper layer of about 60,000 to about 90,000 angstroms can then be provided such as by vacuum evaporation.

A top chrome layer can then be provided to protect the copper from oxidizing such as by vacuum evaporation. This top chrome layer is usually about 400 angstroms to about 800 angstroms.

Photoresist is then applied to both the front and back surfaces of the stainless steel by, for instance, spraying a negative photoresist such as Kodak KTFR ®, followed by drying at about 100° to about 120° C. in an air oven.

The photoresist is then exposed and developed to provide a negative of the desired metal pattern. The photoresist in the case of Kodak KTFR ® is blanket exposed on the stainless steel back side and exposed in the desired predetermined pattern on the circuitry side to define the general profile or shape of the cable referred to as the polymer personality using a Tamarack contact expose projection tool for about 3 to about 5 seconds at about 50 to about 70 millijoules.

The photoresist can then be developed employing a methylchloroform spray, followed by a freon spray rinse.

The chrome and copper layers which are not protected by the photoresist are then etched in typical chrome and copper etchants, respectively. For instance, a potassium permanganate composition containing about 60 grams/liter of the permanganate and about 20 grams/liter of sodium hydroxide is sprayed at about 100° F. for about 1.2 minutes at a spray pressure of about 8 psi to remove the chromium. The substrate is then rinsed in deionized water. A ferric chloride composition of about 1.280 specific gravity is sprayed at about 30° C. for about 1 minute at a pressure of about 8 psi to remove the copper. The bottom chromium layer is removed by the same procedure discussed above. The structure is rinsed in a 75 gram/liter oxalic acid rinse, followed by two deionized water rinses.

The remaining photoresist can then be stripped employing a J-100 strip solution, followed by an xylene rinse, an isopropanol rinse, and 3 hot deionized water rinses, followed by a hot air dry.

The substrate is subjected to a preclean by rinsing in a solution of a detergent, such as Neutra Clean ®, in deionized water heated to about 65° C. to about 2 to about 4 minutes, followed by these deionized water rinses and then a hot air dry.

Next, another layer of photoresist, such as Kodak KTFR ®, is applied to only the top side of the panel, dried at about 100°-120° C. in an air oven, and the photoresist on the top side is blanket exposed using a Tamarack projection tool for 3 to 5 seconds at 55–70 millijoules and then developed by spraying methylchloroform, followed by a freon spray rinse.

Next, another layer of photoresist such as Kodak KTFR ® is applied to the back side of the substrate and dried at about 100° C. to about 120° C. in an air oven. This layer of photoresist is exposed in a predetermined pattern using a Tamarack projection tool for 3 to 5 seconds at 55 to 70 millijoules. The pattern corresponds to that necessary to provide the desired steel pattern of the cable.

The photoresist can then be developed by spraying methylenechloride, followed by a freon spray rinse.

Next, the steel can be removed from those areas, including those to form the first and larger window, and expose the back side of the pads.

This step can be carried out by etching away the exposed steel with a ferric chloride etchant such as by spraying at about 50° C. at about 20 psi for about 4 to about 6 minutes.

The remaining photoresist can then be stripped employing a J-100 strip solution, followed by an xylene rinse, an isopropanol rinse, and 3 hot deionized water rinses, followed by a hot air dry.

The substrate is subjected to a preclean by rinsing in a solution of a detergent, such as Neutra Clean ®, in deionized water heated to about 65° C. for about 2 to about 4 minutes, followed by three dionized water rinses and then a hot air dry.

The polyimide is then removed from the preselected areas by laser etching to provide the general profile or the personality of the cable. The laser etching is carried out with the front side of the part facing towards the laser and employing a wavelength of about 193 to about 351 nanometers with 308 nanometers being preferred and a fluence between about 200 to about 1000 millijoules/cm$^2$, typically about 550 millijoules/cm$^2$, employing a noble gas-halide laser such as xenon chloride or krypton fluoride.

The etching can be done in either a contact or projection mode, with projection mode being preferred.

In the projection mode a mask is made with the pattern to be etched. Where polyimide is to remain the mask is opaque, where polyimide is to be removed the mask is transparent. The preferred mask is made from dielectric coatings and its use and fabrication is described in U.S. Pat. No. 4,684,436 and U.S. patent application Ser. No. 924,480 filed on Oct. 29, 1986, disclosures of which are incorporated herein by reference. Alternatively, a Cr or quartz mask can be used, but such a mask is highly susceptible to damage by the laser. Transfer optics are used to project an image of the mask onto the polyimide and induce etching. It may be necessary to scan the laser across the mask and/or step the part being etched and repeat the etching in new regions of the part in order to etch all the polyimide. A modification of this procedure would not etch all the polyimide, but only sufficient polyimide to remove that polyimide which is bonded to the underlying stainless steel. The fluence from the laser will not be high enough to etch the polyimide so it will be necessary to concentrate the beam. Such fluence concentration is preferably performed before the dielectric mask, but may also be performed by the transfer optics. With a Cr on quartz mask, fluence concentration must be performed with the transfer optics in order to prevent damage to the mask.

In contact mode a contact mask is constructed of some laser resistant material such as molybdenum. Where etching is to occur, the molybdenum is removed to provide an unobstructed path for the laser etch products to be ejected. The contact mask is aligned with the part. Optics are used to shape the excimer laser beam and concentrate the fluence on the part. Complete etching is accomplished by some combination of scanning the excimer laser beam, scanning the part, and stepping the part.

The polyimide is then removed from the preselected areas by laser etching to provide the small window behind the circuit lines and to provide vias beneath the circuit pads. The laser etching is carried out with the back side of the part facing towards the laser and employing a wavelength of about 193 to about 351 nanometers with 308 namometers being preferred and a fluence between about 200 to about 1000 millijoules/cm$^2$, typically about 550 millijoules/cm$^2$, employing a noble gas-halide laser such as xenon chloride or krypton fluoride. The laser etching system can be of either the contact or projection type. Some combination of beam scanning, part stepping and repeating can be used to etch the different polyimide areas as described above.

After this, debris can be removed by a plasma removal such as using a gaseous mixture of $CF_4$, $N_2$, and $O_2$ at about 400 watts of power for about 10 to 20 minutes.

The exposed chromium layers on the pads and circuit lines are removed by etching such as in a potassium permanganate bath. A typical bath contains about 60 grams/liter of potassium permanganate and about 20 grams/liter sodium hydroxide at about 100° F. for about 1.2 minutes.

Next, the part is rinsed in deionized water, followed by an oxalic acid rinse containing about 75 grams oxalic acid per liter and then another deionized water rinse to remove residue such as manganese dioxide from use of the potassium permanganate bath.

The part is further treated by washing with a mild detergent, such as alconox (an alkaline cleaner), followed by two deionized water rinses, a 15% sulfuric acid rinse for about 3 minutes, and a final 2 minute deionized rinse.

The exposed copper is then electroplated with gold to render it capable of being soldered. The electroplating is carried out for about 20 to about 30 minutes to provide gold layers about 20 to about 60 microinches thick.

The part is then rinsed in deionized water for about 5 minutes and air dried.

The part is separated from the titanium frame.

In a still further sequence of fabricating the supporting cables of the present invention, polyimide is applied by roll coating a roll of the stainless steel.

The polyimide can be partially cured at this point such as by heating at about 95° C. for about 12 minutes and then the coated stainless steel is cut to 10"×15" panels.

Next, the polymeric layer can be fully cured, for instance, in the case of a polyimide precursor, can be heated to elevated temperatures typically about 400° C. for typically about 12 minutes under a nitrogen atmosphere in an IR furnace.

After this, debris can be removed by a plasma removal such as using a gaseous mixture of $CF_4$, $N_2$, and $O_2$ at about 400 watts of power for about 10 to 20 minutes.

A chrome layer can then be provided such as by a sputtering technique. This layer is usually about 100 angstroms to about 200 angstroms thick.

A copper layer of about 2,000 to about 3,000 angstroms can then be provided such as by vacuum evaporation.

A negative photoresist is then applied to the back side of the stainless steel such as by a hot roll laminator. A typical photoresist being Du Pont Riston T-168 ®. The photoresist is then blanket exposed by employing, for example, a Tamarack contact expose tool for about 2 to about 5 seconds at about 58 to about 65 millijoules.

Copper is then plated onto the front side of the structure such as from an acid electroplating bath, typical of which being copper sulfate in aqueous sulfuric acid. The electroplatiing is carried out for about 23 minutes at about 125 amperes to a thickness of 90,000 angstroms.

A negative resist typically about 2 mils thick is applied to the front side (chromium-copper side) such as by lamination; a typical resist being Riston T-168 ®.

The photoresist is then exposed to ultraviolet light radiation such as using a Tamarack contact expose tool at about 58 to about 65 millijoules for about 2 to about 5 seconds in the desired pattern to provide the desired circuit pattern.

The photoresist is developed by employing a methylchloroform spray followed by rinsing using a water spray rinse or freon.

If desired, the structure can then be treated to remove unwanted residue and debris such as by plasma type cleaning employing as the plasma gas, about 27% by volume of carbon tetrafluoride, about 5% by volume of nitrogen, and about 68% by volume of oxygen at about 400 watts of power for about 10 to about 20 minutes.

The chrome and copper layers which are not protected by the photoresist are then etched in typical chrome and copper etchants, respectively. The copper can be removed using a ferric chloride composition of about 1.260 specific gravity sprayed at about 30° C. for about 1 minute at a pressure of about 8 psi. A potassium permanganate composition containing about 60 grams/liter of the permanganate and about 20 grams/liter of sodium hydroxide is sprayed at about 100° F. for about 1.2 minutes at a spray pressure of about 8 psi can be used to remove the chromium.

The panel can be rinsed with oxalic acid aqueous solution such as a 75 gram/liter solution, followed by two deionized water rinses.

The remaining resist can then be removed, for instance, in the case of Du Pont Riston T-168 ®, employing methylene chloride spray.

The part is then cleaned such as by using Posi-Clean detergent cleaner in deionized water at about 50° C. by spraying at about 10 psi, followed by three deionized water rinses and a hot air dry.

Next, photoresist is applied to both sides of the stainless steel such as by a hot roll lamination. A typical photoresist being Du Pont Riston T-168 ®. The photoresist on the circuitry side is blanket exposed and on the stainless steel side is exposed in a predetermined pattern using a Tamarack contact expose tool for about 2 to 5 seconds at 58–60 millijoules. The pattern corresponds to that necessary to provide the desired steel pattern on the cable.

The photoresist is developed by spraying methylchloroform as discussed above, followed by a water rinse.

Next, the steel can be removed from the desired areas, including those areas to form the first layer and larger window and expose the back side of the pads.

This step can be carried out by etching away the exposed steel with a ferric chloride etchant such as by spraying at about 20 psi at about 50° C. for about 4 to about 6 minutes.

The remaining photoresist is removed by spraying a solvent for the photoresist such as methylene chloride at about 18 psi for about 2 to 3 minutes, followed by a spray water rinse.

The polyimide is then removed from the preselected areas by laser etching to provide the overall profile or the personality of the cable. The laser etching is carried out with the front side of the part facing towards the laser and employing a wavelength of about 193 to about 351 nanometers with 308 nanometers being preferred and a fluence between about 200 to about 1000 millijoules/cm$^2$, typically about 550 millijoules/cm$^2$, employing a noble gas-halide laser such as xenon chloride or krypton fluoride.

The etching can be done in either a contact or projection mode, with projection mode being preferred.

In the projection mode a mask is made with the pattern to be etched. Where polyimide is to remain the mask is opaque, where polyimide is to be removed the mask is transparent. The preferred mask is made from dielectric coatings and its use and fabrication is described in U.S. Pat. No. 4,684,436 and U.S. patent application Ser. No. 924,480 filed on Oct. 29, 1986, disclosures of which are incorporated herein by reference. Alternatively, a Cr on quartz mask can be used, but such a mask is highly susceptible to damage by the laser. Transfer optics are used to project an image of the mask onto the polyimide and induce etching. It may be necessary to scan the laser across the mask and/or step the part being etched and repeat the etching in new regions of the part in order to etch all the polyimide. A modification of this procedure would not etch all the polyimide, but only sufficient polyimide to remove that polyimide which is bonded to the underlying stainless steel. The fluence from the laser will not be high enough to etch the polyimide so it will be necessary to concentrate the beam. Such fluence concentration is preferably performed before the dielectric mask, but may also be performed by the transfer optics. With a Cr on quartz mask, fluence concentration must be performed with the transfer optics in order to prevent damage to the mask.

In contact mode a contact mask is constructed of some laser resistant material sucha as molybdenum. Where etching is to occur, the molybdenum is removed to provide an unobstructed path for the laser etch products to be ejected. The contact mask is aligned with the part. Optics are used to shape the excimer laser beam and concentrate the fluence on the part. Complete etching is accomplished by some combination of scanning the excimer laser beam, scanning the part, and stepping the part.

The polyimide is then removed from the preselected areas by laser etching to provide the small window behind the circuit lines and to provide vias beneath the circuit pads. The laser etching is carried out with the back side of the part facing towards the laser and employing a wavelength of about 193 to about 351 nanometers with 308 nanometers being preferred and fluence between about 200 to about 1000 millijoules/cm$^2$ using either a contact or projection etching system.

After this, debris can be removed by a plasma removal such as using a gaseous mixture of $CF_4$, $N_2$, and $O_2$ at about 400 watts of power for about 10 to 20 minutes.

The exposed chromium layers on the pads and circuit lines are removed by etching such as in a potassium permanganate bath. A typical bath contains about 60 grams/liter of potassium permanganate and about 20 grams/liter sodium hydroxide at about 100° F. for about 1.2 minutes.

Next, the part is rinsed in deionized water, followed by an oxalic acid rinse containing about 75 grams oxalic acid per liter and then another deionized water rinse to remove residue such as manganese dioxide from use of the potassium permanganate bath.

The part is further treated by washing with a mild detergent, such as alconox (an alkaline cleaner), followed by two deionized water rinses, a 15% sulfuric acid rinse for about 3 minutes, and a final 2 minute deionized rinse.

The exposed copper is then electroplated with gold to render it capable of being soldered. The electroplating is carried out for about 20 to about 30 minutes to provide gold layers about 20 to about 60 microinches thick.

The part is then rinsed in deionized water for about 5 minutes and air dried.

In another alternative sequence of fabricating the supporting cables of the present invention, the stainless steel foil is attached to a titanium window frame by spot welding. A typical size for the titanium frame is about 44 mm. The stainless steel is 0.0015"–0.002" thick stress relieved stainless steel.

A polymeric coating is then applied to the stainless steel foil such as by spraying or roll coating. The polymeric coating is preferably a thermosetting polymer and most preferably a polyimide. The polyimide can be applied from a solution of polyamic acid precursor or laminated as a film (e.g.—Kapton ®).

The polyimide can be partially cured at this point such as by heating at about 95° C. for about 12 minutes.

Next, a pattern is etched in the polyimide to correspond to the general profile or shape of the cable, as well as the pad areas and window beneath the circuit lines. The etching can be accomplished by employing well-known photoresist and photolithographic processing. For instance, a negative resist typically about 0.0005 inches thick is applied such as by spraying; a typical resist being Kodak KTFR ®. The photoresist is then dried at about 100°-120° in an air oven.

The photoresist is then exposed to ultraviolet light radiation such as by using a Tamarack projection expose tool at about 58 to about 65 millijoules.

The photoresist is developed by employing a methylchoroform spray, followed by rinsing using a water spray rinse or freon.

Next, the polyimide in the desired areas, including the pad areas and the window beneath the circuit lines, is etched. The polyimide can be etched by spraying with potassium hydroxide of about 0.23 molar at about 45° C. at about 15 psi for about 20 seconds.

Next, the substrate is sprayed with oxalic acid/water for about 1 minute at about 6 psi, followed by a deionized water rinse.

The photoresist can then be stripped employing a J-100 strip solution, followed by an xylene rinse, an isopropanol rinse, and a deionized water rinse.

Next, the polymeric layer can be cured, for instance, in the case of a polyimide precursor, can be heated to elevated temperatures typically about 300° C. to about 400° C., typical of which is about 350° C., for about 10 minutes to about 30 minutes, typically of which is about 20 minutes in a nitrogen atmosphere furnace.

If desired, the structure can then be treated to remove unwanted residue and debris such as by a plasma cleaning employing as the plasma gases about 27% by volume of carbon tetrafluoride, about 5% by volume of nitrogen, and about 68% by volume of oxygen at about 400 watts of power for about 10 to about 20 minutes.

A chrome layer can then be provided such as by a vacuum evaporation technique. This layer is usually about 400 angstroms to about 800 angstroms.

A copper layer of about 60,000 to about 90,000 angstroms can then be provided such as by vacuum evaporation.

A top chrome layer can then be provided to protect the copper from oxidizing such as by vacuum evaporation. This top chrome layer is usually about 400 angstroms to about 800 angstroms.

A photoresist is then applied to both sides of the structure by, for instance, spraying a negative photoresist such as Kodak KTFR ®, followed by drying at about 100° to about 120° C. in an air oven and blanket expose on the back side and circuit expose on the front side and develop to provide the desired metal pattern on the front side of the structure. The photoresist in the case of the Kodak KTFR ® can be exposed on a Tamarack contact expose projection tool for about 3 to about 5 seconds at about 50 to about 70 millijoules.

The photoresist can be developed employing a methylchloroform spray, followed by a freon spray rinse.

The chrome and copper layers which are not protected by the photoresist are then etched in typical chrome and copper etchants, respectively. For instance, a potassium permanganate composition containing about 60 grams/liter of the permanganate and about 20 grams/liter of sodium hydroxide is sprayed at about 100° F. for about 1.2 minutes at a spray pressure of about 8 psi to remove the chromium. The substrate is then rinsed in deionized water. A ferric chloride composition of about 1.280 specific gravity is sprayed at about 30° C. for about 1 minute at a pressure of about 8 psi to remove the copper. The bottom chromium layer is removed by the same procedure discussed above. The structure is rinsed in a 75 gram/liter oxalic acid rinse, followed by two deionized water rinses.

At this point, the polyimide pattern and circuit pattern are defined.

Next, the photoresist is applied to both sides of the stainless steel such as by spraying Kodak KFTR ®. The photoresist on the circuitry side is blanket exposed and exposed on the stainless steel side in a predetermined pattern using a Tamarack projection as discussed above. The pattern corresponds to that necessary to provide the desired steel pattern of the cable.

The photoresist is developed by spraying methylchloroform. The part is then rinsed using freon.

Next, the steel can be removed from those areas to form the first and larger window and expose the back side of the pads.

This step can be carried out by etching away the exposed steel with a ferric chloride etchant such as by spraying at about 50° C. at about 20 psi for about 4 to about 6 minutes.

The remaining photoresist is removed by dipping into a solvent for the photoresist such as J-100.

In a further sequence of fabricating the supporting cables of the present invention, polyimide is applied by roll coating a roll of the stainless steel. The stainless steel is typically 0.0015 inch to 0.002 inch thick stress relieved stainless steel.

The polyimide can be partially cured at this point such as by heating at about 95° C. for about 12 minutes and then the coated stainless steel is cut to 10"×15" panels.

Next, a pattern is etched in the polyimide to correspond to the general profile or shape of the cable, as well as the pad areas and window beneath the circuit lines. The etching can be accomplished by employing well-known photoresist and photolithographic processing. For instance, a negative resist typically about 2 mils thick is applied such as by lamination; a typical resist being Riston T-168 ®.

The photoresist is then exposed to ultraviolet light radiation such as using a Tamarack contact expose tool at about 60 to about 70 millijoules.

The photoresist is developed by employing a methylchloroform spray followed by rinsing using a water spray rinse or freon.

Next, the polyimide in the desired areas, including the pad areas and the window beneath the circuit lines, is etched. The polyimide can be etched by spraying with potassium hydroxide of about 0.23 molar at about 45° C. at about 15 psi for about 20 seconds.

Next, the substrate is sprayed with oxalic acid/water for about 1 minute at about 6 psi, followed by two deionized water rinses.

The photoresist can then be stripped employing a methylene chloride spray at about 18 psi for about 2 to about 3 minutes, followed by a spray water rinse.

Next, the polymeric layer can be cured, for instance, in the case of a polyimide precursor, by heating to elevated temperatures typically about 400° C. for typically about 12 minutes under a nitrogen atmosphere in an IR furnace.

If desired, the structure can then be treated to remove unwanted residue and debris, such as by a plasma cleaning, employing as the plasma gas about 27% by volume of carbon tetrafluoride, about 5% by volume of nitrogen, and about 68% by volume of oxygen at 400 watts of power for about 10 to about 20 minutes.

A chromium layer can then be provided such as by a sputtering technique. This layer is usually about 100 angstroms to about 200 angstroms thick.

A copper layer of about 2,000 to about 3,000 angstroms can then be provided such as by vacuum evaporation. The copper is then plated up to a thickness of about 90,000 angstroms from an acid electroplating bath, typical of which being copper sulfate in an aqueous sulfuric acid. The electroplating is carried out for about 23 minutes at about 125 amperes.

A negative photoresist is then applied to both sides of the panel such as by a hot roll lamination. A typical photoresist being Du Pont Riston T-168 ®. The photoresist is then blanket exposed on the stainless steel side and exposed on the circuitry side in the desired predetermined pattern using a Tamarack contact expose tool for about 2 to about 5 seconds at about 58 to about 65 millijoules.

The photoresist can then be developed employing a methylchloroform spray, followed by a deionized water rinse.

The copper and chrome layers which are not protected by the photoresist are then etched in typical copper and chrome etchants, respectively. For instance, a ferric chloride composition of about 1.260 specific gravity is sprayed at about 30° C. for about 1 minute at a pressure of about 8 psi to remove the copper.

A potassium permanganate composition containing about 60 grams/liter of permanganate and about 20 grams/liter of sodium hydroxide is sprayed at about 100° F. for about 1.2 minutes at a spraying pressure of about 8 psi to remove the chromium.

The remaining photoresist can then be removed employing a methylene chloride spray at about 18 psi for about 2 to 3 minutes, followed by a water rinse. At this point, the polyimide pattern and circuit pattern are defined.

Next, photoresist is applied to both sides of the stainless steel such as by a hot roll lamination. A typical photoresist being Du Pont Riston T-168 ®. The photoresist on the circuitry side is blanket exposed and on the stainless steel side is exposed in a predetermined pattern using a Tamarack contact expose tool. The pattern corresponds to that necessary to provide the desired steel pattern on the cable.

The photoresist is developed by spraying methylchloroform, followed by a water rinse.

Next, the steel can be removed from those areas to form the first layer and larger window and expose the back side of the pads.

This step can be carried out by etching away the exposed steel with a ferric chloride etchant such as by spraying.

The remaining photoresist is removed by spraying with methylene chloride at about 18 psi for 2 to 3 minutes, followed by a spray water rinse.

In a further sequence of fabricating the supporting cables of the present invention, the stainless steel foil is attached to a titanium window frame by spot welding. A typical size for the titanium frame is about 44 mm. The steel being a 0.0015" to 0.002" thick stress relieved stainless steel.

A polymeric coating is then applied to one surface of the stainless steel foil such as by spraying. The polymeric coating is preferably a thermosetting polymer and most preferably a polyimide. The polyimide can be applied from a solution of polyamic acid precursor or laminated as a film (e.g.—Kapton ®).

The polyimide can be partially cured at this point such as by heating at about 95° C. for about 12 minutes.

Next, the polymeric layer can be fully cured, for instance, in the case of a polyimide, by heating to elevated temperatures such as about 300° C. to about 400° C., typical of which is about 350° C. for about 10 to about 30 minutes; typical of which is about 20 minutes in a nitrogen atmosphere furnace.

If desired, the structure can then be cleaned to remove unwanted residue and debris such as by plasma type cleaning employing as the plasma gases about 27% by volume of carbon tetrafluoride, about 5% by volume of nitrogen, and about 68% by volume of oxygen at 400 watts of power for about 10 to about 20 minutes.

A chrome layer can then be provided such as by evaporation. This layer is usually about 400 angstroms to about 800 angstroms thick.

A copper layer of about 60,000 to about 90,000 angstroms can then be provided such as by vacuum evaporation.

A top chrome layer can then be provided to protect the copper from oxidizing such as by vacuum evaporation. This top chrome layer is usually about 400 angstroms to about 800 angstroms.

Photoresist is then applied to both the front and back surfaces of the stainless steel by, for instance, spraying a negative photoresist such as Kodak KTFR ®, followed by drying at about 100° to about 120° C. in an air oven.

The photoresist is then exposed and developed to provide a negative of the desired polyimide pattern. The photoresist in the case of Kodak KTFR ® is blanket exposed on the stainless steel back side and exposed in the desired predetermined pattern on the circuitry side to define the general profile or shape of the polymer personality using a Tamarack contact expose projection tool for about 3 to about 5 seconds at about 50 to about 70 millijoules.

The photoresist can then be developed employing a methylchloroform spray, followed by a freon spray rinse.

The chrome and copper layers which are not protected by the photoresist are then etched in typical chrome and copper etchants, respectively. For instance, a potassium permanganate composition containing about 60 grams/liter of the permanganate and about 20 grams/liter of sodium hydroxide is sprayed at about 100° F. for about 1.2 minutes at a spray pressure of about 8 psi to remove the chromium. The substrate is then rinsed in deionized water. A ferric chloride composition of about 1.280 specific gravity is sprayed at about 30° C. for about 1 minute at a pressure of about 8 psi to remove the copper. The bottom chromium layer is removed by the same procedure discussed above. The structure is rinsed in a 75 gram/liter oxalic acid rinse, followed by two deionized water rinses.

The remaining photoresist can then be stripped employing a J-100 strip solution, followed by an xylene rinse, an isopropanol rinse, and 3 hot deionized water rinses, followed by a hot air dry.

The polyimide is then removed from the preselected areas by laser etching to provide the general profile or personality for the polyimide using the chromium-copper-chromium as a contact mask. The laser etching is carried out employing a wavelength of about 193 to about 351 nanometers with 308 nanometers being preferred and a fluence of about 500 to about 1500 millijoules/cm$^2$ on the polyimide surface.

Next, photoresist is applied to both sides of the cable such as by spraying Kodak KTFR ®, which is dried at about 100° C. to about 120° C. in an air oven. The photoresist on the stainless steel side is blanket exposed and exposed on the front chromium-copper-chromium side in a predetermined circuity pattern using a Tamarack projection tool for about 3 to about 5 seconds at 55 to about 70 millijoules.

The photoresist is developed by spraying methylchloroform. The part is then rinsed in freon.

The chrome and copper layers which are not protected by the photoresist are then etched in typical chrome and copper etchants, respectively. For instance, a potassium permanganate composition containing about 60 grams/liter of the permanganate and about 20 grams/liter of sodium hydroxide is sprayed at about 100° F. for about 1.2 minutes at a spray pressure of about 8 psi to remove the chromium. The substrate is then rinsed in deionized water. A ferric chloride composition of about 1.280 specific gravity is sprayed at about 30° C. for about 1 minute at a pressure of about 8 psi to remove the copper. The bottom chromium layer is removed by the same procedure discussed above. The structure is rinsed in a 75 gram/liter oxalic acid rinse, followed by two deionized water rinses. This defines the circuit pattern.

The remaining photoresist is removed by dipping into a solvent for the photoresist such as J-100, followed by three xylene rinses, an isopropanol rinse, and three hot deionized water rinses, and then hot air dried.

The panel is then precleaned by using a Neutra-Clean detergent in deionized water heated to about 65° C. for about 2 to about 4 minutes, followed by three deionized water rinses and a hot air dry.

Next, a negative photoresist such as Kodak KTFR ® is sprayed onto the circuitry side of the cable, followed by drying at about 100° C. to about 120° C. in an air oven.

The photoresist on the top circuitry side is blanket exposed using a Tamarack projection tool for about 3 to about 5 seconds at 55 to about 70 millijoules.

The result is developed employing a methylchloroform spray, followed by a freon spray rinse.

Next, a negative photoresist such as Kodak KTFR ® is sprayed onto the stainless steel back side of the cable, followed by drying at about 100° C. to about 120° C. in an air oven.

The back side is exposed in a predetermined pattern to define the stainless steel profile using a Tamarack projection tool for about 3 to about 5 seconds at about 55 to about 70 millijoules. The photoresist is developed by spraying methylchloroform, followed by a freon spray rinse.

Next, the steel can be removed, including from those areas to form the first layer and larger window and expose the back side of the pads.

This step can be carried out by etching away the exposed steel with a ferric chloride etchant such as by spraying at about 50° C. at about 20 psi for about 4 to about 6 minutes.

The remaining photoresist is removed by dipping into a solvent for the photoresist such as J-100, followed by three xylene rinses, an isopropanol rinse, three hot deionized water rinses, and a hot air dry.

The polyimide is then removed from the preselected areas by laser etching to provide the small window behind the circuit lines and to provide vias beneath the circuit pads. The laser etching is carried out with the back side of the part facing towards the laser and employing a wavelength of about 193 to about 351 nanometers with 308 nanometers being preferred and a fluence between about 200 to about 1000 millijoules/cm$^2$, typically about 550 millijoules/cm$^2$, employing a noble gas-halide laser such as xenon chloride or krypton fluoride. The etching system can be of either the contact or projection type. Some combination of beam scanning, and/or part stepping and repeating can be used to etch the different polyimide areas.

After this, debris can be removed by a plasma removal such as using a gaseous mixture of $CF_4$, $N_2$, and $O_2$ at about 400 watts of power for about 10 to 20 minutes.

The exposed chromium on the pads are removed by etching such as in a potassium permanganate bath. A typical bath contains about 60 grams/liter of potassium permanganate and about 20 grams/liter sodium hydroxide at about 100° F. for about 1.2 minutes.

Next, the part is rinsed in deionized water, followed by an oxalic acid rinse containing about 75 grams oxalic acid per liter and then another deionized water rinse. The part is further treated by washing with a mild detergent, followed by two deionized water rinses, a 15% sulfuric acid rinse for about 3 minutes, and a final 2 minute deionized water rinse.

The exposed copper is then electroplated with gold to render it capable of being soldered. The electroplating is carried out for about 20 to about 30 minutes to provide gold layers about 20 to about 60 microinches thick.

The part is then rinsed in deionized water for about 5 minutes and air dried.

The part is then separated from the titanium frame.

In a still further sequence of fabricating the supporting cables of the present invention, polyimide is applied by roll coating a roll of the stainless steel.

The polyimide can be partially cured at this point such as by heating at about 95° C. for about 12 minutes and then the coated stainless steel is cut to 10"×15" panels.

Next, the polymeric layer can be fully cured, for instance, in the case of a polyimide precursor, can be heated to elevated temperatures typically about 400° C. for typically about 12 minutes under a nitrogen atmosphere in an IR furnace.

After this, debris can be removed by a plasma removal such as using a gaseous mixture of $CF_4$, $N_2$, and $O_2$ at about 400 watts of power for about 10 to 20 minutes.

A chrome layer can then be provided such as by a sputtering technique. This layer is usually about 100 angstroms to about 200 angstroms thick.

A copper layer of about 2,000 to about 3,000 angstroms can then be provided such as by vacuum evaporation.

A negative photoresist is then applied to the back side of the stainless steel such as by a hot roll laminator. A typical photoresist being Du Pont Riston T-168 ®. The photoresist is then blanket exposed by employing, for example, a Tamarack contact expose tool for about 2 to about 5 seconds at about 58 to about 65 millijoules.

Copper is then plated onto the front side of the structure to provide a total copper thickness of about 90,000 angstroms, such as from an acid electroplating bath, typical of which being copper sulfate in aqueous sulfuric acid. The electroplating is carried out for about 23 minutes at about 125 amperes.

A negative resist typically about 2 mils thick is applied to the front side (chromium-copper side) such as by lamination; a typical resist being Riston T-168 ®.

The photoresist is then exposed to ultraviolet light radiation such as using a Tamarack contact expose tool at about 58 to about 65 millijoules for about 2 to about 5 seconds in the desired pattern to provide the general shape or profile (personality) of the cable.

The photoresist is developed by employing a methylchloroform spray followed by rinsing using a water spray rinse or freon.

If desired, the structure can then be treated to remove unwanted residue and debris such as by employing a plasma type clean employing as the plasma gas, about 27% by volume of carbon tetrafluoride, about 5% by volume of nitrogen, and about 68% by volume of oxygen at about 400 watts of power for about 10 to about 20 minutes.

The chrome and copper layers which are not protected by the photoresist are then etched in typical chrome and copper etchants, respectively. The copper can be removed using a ferric chloride composition of about 1.260 specific gravity sprayed at about 30° C. for about 1 minute at a pressure of about 8 psi. A potassium permanganate composition containing about 60 grams/liter of the permanganate and about 20 grams/liter of sodium hydroxide is sprayed at about 100° F. for about 1.2 minutes at a spray pressure of about 8 psi to remove the chromium.

The remaining resist can then be removed, for instance, in the case of Du Pont Riston T-168 ®, employing a methylene chloride spray at 18 psi for about 2 to 3 minutes, followed by a spray water rinse.

The polyimide is then removed from the preselected areas by laser etching to provide the overall polyimide profile. The laser etching is carried out with the front side of the part facing towards the laser and employing a wavelength of about 193 to about 351 nanometers with 308 nanometers being preferred and a fluence between about 500 to about 1500 millijoules/cm$^2$, typically about 550 millijoules/cm$^2$, employing a noble gas-halide laser such as xenon chloride or krypton fluoride.

The etching is carried out by scanning the beam across part or part under the beam to etch the polymer. The panel is stepped to expose the next section of polymer to be removed. The scanning and stepping is repeated until all of the desired polymer is removed. The chromium-copper acts as a contact mask.

Negative photoresist is then applied to the back side and the circuit side of the stainless steel such as by a hot roll lamination. A typical photoresist being Du Pont Riston T-168 ®. The photoresist on the back side of the stainless steel is blanket exposed and the front chromium-copper coated side is exposed to provide the desired circuit pattern using a Tamarack contact expose tool for 2 to 5 seconds at 58 to 65 millijoules.

The photoresist is developed by spraying methylchloroform as discussed above, followed by spraying with deionized water.

If desired, the structure can then be treated to remove unwanted residue and debris such as by employing a plasmad type clean employing as the plasma gas, about 27% by volume of carbon tetrafluoride, about 5% by volume of nitrogen, and about 68% by volume of oxygen at about 400 watts of power for about 10 to about 20 minutes.

The copper and chrome layers which are not protected by the photoresist are then etched in typical copper and chrome etchants, respectively. For instance, a ferric chloride composition of about 1.260 specific gravity is sprayed at about 30° C. for about 1 minute at a pressure of about 8 psi to remove the copper.

A potassium permanganate composition containing about 60 grams/liter of permanganate and about 20 grams/liter of sodium hydroxide is sprayed at about 100° F. for about 1.2 minutes at a spraying pressure of about 8 psi to remove the chromium. This defines the circuit pattern.

The remaining photoresist can then be removed employing a methylene chloride spray at about 18 psi for about 2 to 3 minutes, followed by a water rinse.

The part is then cleaned such as by using Posi-Clean detergent cleaner in deionized water at about 50° C. by spraying at about 10 psi, followed by three deionized water rinses and a hot air dry.

Next, photoresist is applied to both sides of the stainless steel such as by a hot roll lamination. A typical photoresist being Du Pont Riston T-168 ®. The photoresist on the circuitry side is blanket exposed and on the stainless steel side is exposed in a predetermined pattern using a Tamarack contact expose tool for about 2 to 5 seconds at 58–60 millijoules. The pattern corresponds to that necessary to provide the desired steel pattern on the cable.

The photoresist is developed by spraying methylchloroform, followed by a water rinse.

Next, the steel can be removed from those areas to form the first layer and larger window and expose the back side of the pads.

This step can be carried out by etching away the exposed steel with a ferric chloride etchant (1.360 specific gravity) such as by spraying at about 20 psi at about 50° C. for about 4 to about 6 minutes.

The remaining photoresist is removed by spraying with methylene chloride at about 18 psi for 2 to 3 minutes, followed by a water rinse.

The polyimide is then removed from the preselected areas by laser etching to provide the small window behind the circuit lines and to provide vias beneath the circuit pads. The laser etching is carried out with the back side of the part facing towards the laser and employing a wavelength of about 193 to about 351 nanometers with 308 nanometers being preferred and a fluence between about 200 to about 1000 millijoules/cm$^2$, typically about 550 millijoules/cm$^2$, employing a noble gas-halide laser such as xenon chloride or krypton fluoride. The laser etching system can be of either the contact or projection type. Some combination of beam scanning, and/or part stepping and repeating can be used to etch the different polyimide areas.

After this, debris can be removed by plasma removal such as using a gaseous mixture of $CF_4$, $N_2$, and $O_2$ at about 400 watts of power for about 10 to 20 minutes.

The exposed chromium on the pads is removed by etching such as in a potassium permanganate bath. A typical bath contains about 60 grams/liter of potassium permanganate and about 20 grams/liter sodium hydroxide at about 100° F. for about 1.2 minutes.

Next, the part is rinsed in deionized water, followed by an oxalic acid rinse containing about 75 grams oxalic acid per liter and then another deionized water rinse. The part is further treated by washing with a mild detergent, followed by two deionized water rinses, a 15% sulfuric acid rinse for about 3 minutes, and a final 2 minute deionized rinse.

The exposed copper is then electroplated with gold to render it capable of being soldered. The electroplating is carried out for about 20 to about 30 minutes to provide gold layers about 20 to about 60 microinches thick.

The part is then rinsed in deionized water for about 5 minutes and air dried.

Optionally, in any of the procedures, and if desired, the circuitry that is not to be contacted or soldered can be coated with a polyimide protective coating.

Having thus described our invention, what we claim as new and desire to secure by Letters Patent is:

1. A flexible supporting cable for an electronic device which comprises:
   stainless steel foil substrate;

layer of polymer on selected portions of said substrate;

circuit pads at selected locations on said layer of polymer, said circuit pads having a top side and bottom side and, wherein vias are provided in said steel foil substrate and layer of polymer beneath said pads so as to expose the bottom surfaces of said pads;

circuit lines extending from the top side of said pads wherein a first window free from steel is provided beneath a portion of and including the extremities of said circuit lines; and wherein a second window, smaller than said first window, free from said steel and said layer of polymer is provided beneath a portion of said circuit lines and in the vicinity of the extremities of said circuit lines.

2. The cable of claim 1 wherein said steel foil is about 1½ mils to about 2 mils thick.

3. The cable of claim 1 wherein said polymer is a polyimide and said layer of polymer is about 2 microns to about 30 microns thick.

4. The cable of claim 3 wherein said layer of polymer is about 5 microns to about 10 microns thick.

5. The cable of claim 1 wherein said circuit pads are from gold coated on copper.

6. The cable of claim 1 wherein said steel foil is about 1½ mils to about 2 mils thick; said polymer is a polyimide and said layer of polymer is about 5 microns to about 10 microns thick.

* * * * *